United States Patent [19]

Ogle

[11] Patent Number: 4,948,458

[45] Date of Patent: Aug. 14, 1990

[54] METHOD AND APPARATUS FOR PRODUCING MAGNETICALLY-COUPLED PLANAR PLASMA

[75] Inventor: John S. Ogle, Milpitas, Calif.

[73] Assignee: LAM Research Corporation, Fremont, Calif.

[21] Appl. No.: 393,504

[22] Filed: Aug. 14, 1989

[51] Int. Cl.⁵ .................. H01L 21/306; B44C 1/22; C03C 15/00; C03C 25/06

[52] U.S. Cl. .................... 156/643; 118/50.1; 118/728; 118/623; 156/646; 156/657; 156/662; 156/345; 204/192.32; 204/298.03; 427/38

[58] Field of Search ............ 156/643, 646, 653, 657, 156/662, 345; 204/192.32, 192.35, 192.37, 298; 118/50.1, 728, 620, 623; 427/38, 39

[56] References Cited

U.S. PATENT DOCUMENTS

| | | | |
|---|---|---|---|
| 4,368,092 | 1/1983 | Steinberg et al. | 156/345 |
| 4,421,898 | 2/1984 | Reinberg et al. | 156/646 X |
| 4,557,819 | 12/1985 | Meacham et al. | 156/345 X |
| 4,626,312 | 12/1986 | Tracy | 156/345 |
| 4,668,338 | 5/1987 | Maydan et al. | 156/643 |
| 4,668,365 | 5/1987 | Foster et al. | 204/192.23 |

OTHER PUBLICATIONS

Skidmore (1989) Semiconductor International, Jun. 1989, pp. 74-79.

Primary Examiner—William A. Powell
Attorney, Agent, or Firm—Townsend and Townsend

[57] ABSTRACT

An apparatus for producing a planar plasma in a low pressure process gas includes a chamber and an external planar coil. Radiofrequency resonant current is induced in the planar coil which in turn produces a planar magnetic field within the exclosure. The magnetic field causes circulating flux of electrons which in turn produces a planar region of ionic and radical species. The system may be used for plasma treatment of a variety of planar articles, typically semiconductor wafers which are oriented parallel to the plasma within the enclosure.

24 Claims, 3 Drawing Sheets

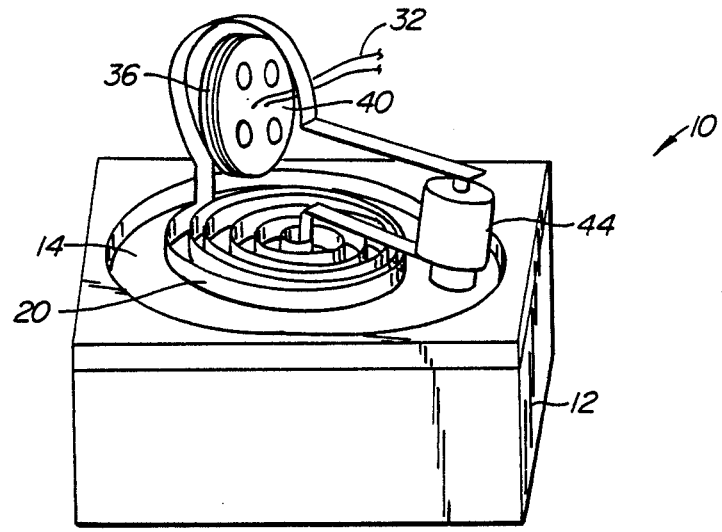
FIG._1.
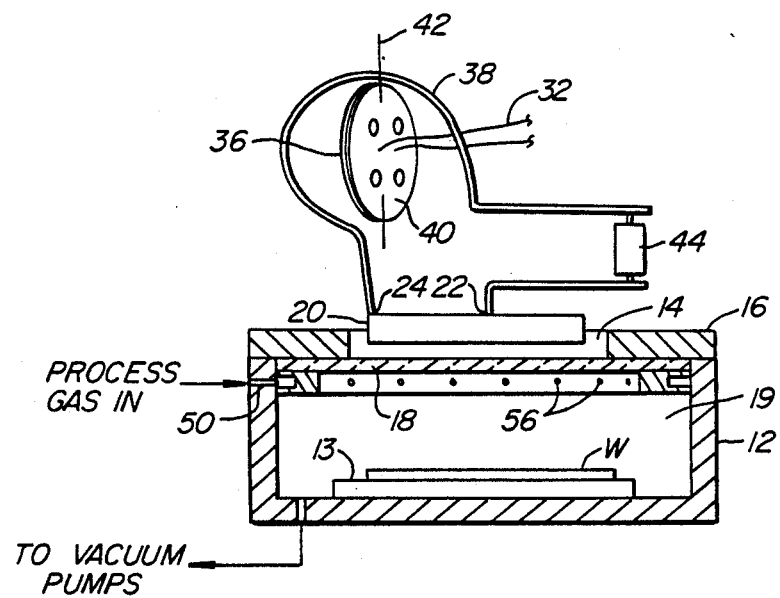
FIG._2.

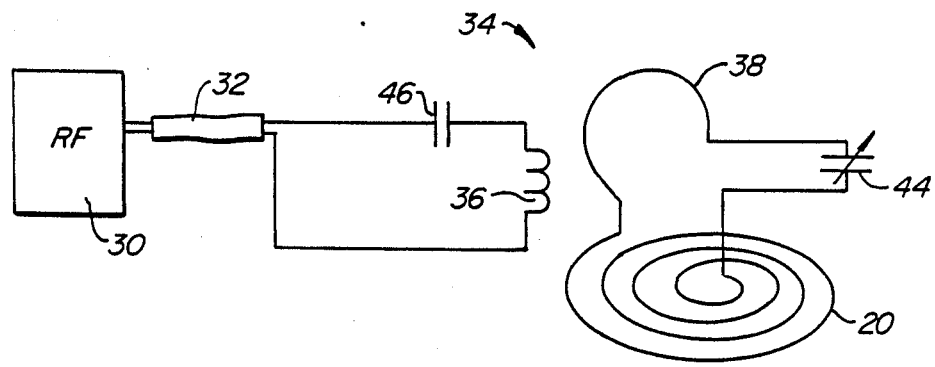
FIG._3.
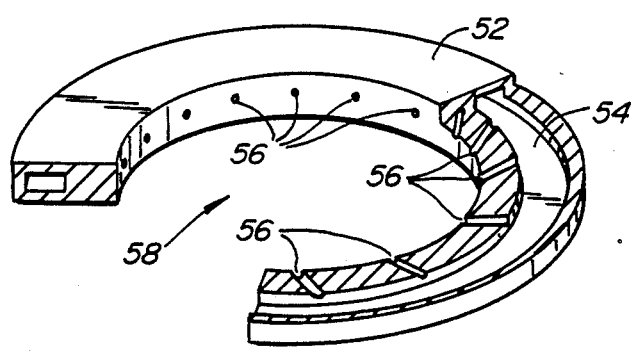
FIG._4.
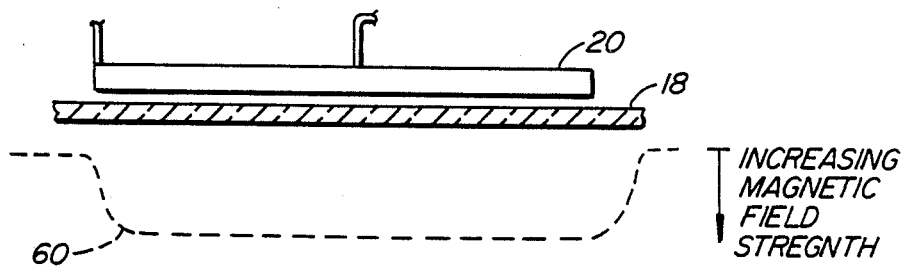
FIG._5.

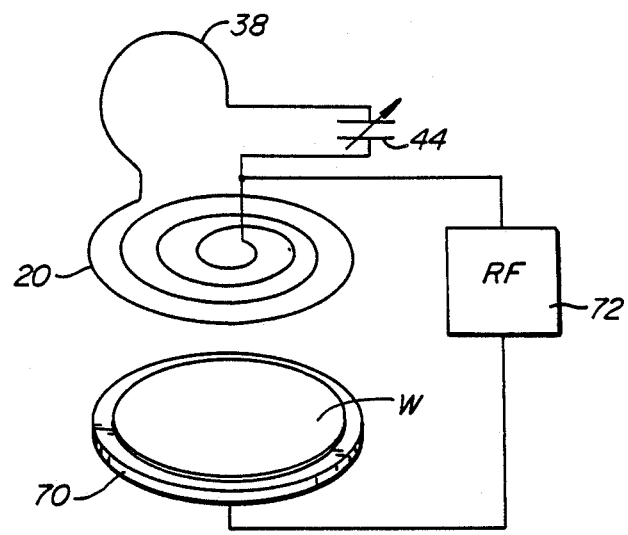
FIG._6.
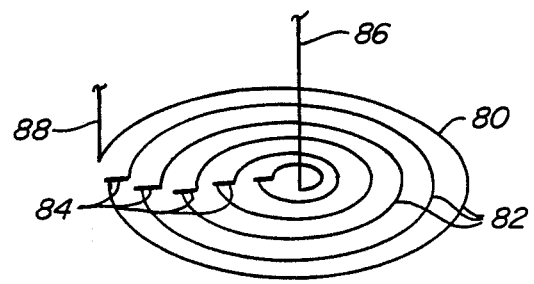
FIG._7.

METHOD AND APPARATUS FOR PRODUCING MAGNETICALLY-COUPLED PLANAR PLASMA

BACKGROUND OF THE INVENTION

1. Field of the Invention

The present invention relates generally to apparatus and methods for producing low pressure plasmas. More particularly, the present invention relates to the production of a highly uniform planar plasma which can be used for treating semiconductor wafers in low pressure processing equipment.

Plasma generation is useful in a variety of semiconductor fabrication processes, including etching, resist stripping, passivation, deposition, and the like. Generally, plasmas may be produced from a low-pressure process gas by inducing an electron flow which ionizes individual gas molecules through the transfer of kinetic energy through individual electron-gas molecule collisions. Most commonly, the electrons are accelerated in an electric field, typically a radiofrequency electric field produced between a pair of opposed electrodes which are oriented parallel to the wafer.

The use of an electric field normal to the wafer to accelerate the electrons, however, does not provide efficient conversion of the kinetic energy to ions, especially at low frequencies and pressures below about 0.1 Torr. Under such conditions, a large portion of the electron energy is dissipated through electron collisions with the walls of the processing chamber or with the semiconductor wafer itself. The direct collision of electrons with the semiconductor wafer is not only energetically wasteful, but can also cause wafer heating which is highly disadvantageous.

Several methods have been proposed to increase the efficiency of plasma generation for use in semiconductor processing equipment. For example, microwave resonance chambers use ultra high frequencies (e.g., 2.45 GHz) which shorten the electron oscillation path and increase the likelihood of transferring the electron energy to the process gas molecules rather than the walls of the process vessel or the semiconductor wafer. Electron cyclotron resonance (ECR), in contrast, uses a controlled magnetic field to induce a circular electron flow within the process gas. While achieving relatively high energy conversion efficiencies, both these methods generate a highly non-uniform plasma which must be made uniform prior to exposure to the semiconductor wafer. Usually, a certain degree of uniformity can be achieved by flowing the plasma some distance prior to exposure to the wafer or wafers. The need to provide the additional flow path, however, allows some ion recombination which reduces the effectiveness of the plasma. Each system also suffers from pressure operating range limitations. Microwave resonance chambers are generally effective for process gas pressures from about 1 to 760 Torr, while ECR is effective from 0.0001 to 0.1 Torr. Moreover, the cost and design complexity of both systems are increased by the need to provide the extra flow distance, and the magnetic field required by the ECR system is difficult to control.

Other approaches for enhancing the efficiency of plasma generation in semiconductor processing equipment include magnetically-enhanced plasma systems (such as magnetically-enhanced reactive ion etching) and inductively-coupled electron acceleration, commonly called inductively-coupled plasma. Magnetically-enhanced plasma systems produce a constant magnetic field parallel to the wafer surface and a high frequency electrical field perpendicular to the wafer surface. The combined forces cause the electron to follow a cycloidal path, increasing the distance traveled relative to the straight path which would be induced by the electric field alone. This approach can provide good ion generation efficiency, but the large uniform magnetic field required for semiconductor processing is very difficult to maintain. Also, operation of the magnetically-enhanced systems is generally limited to a pressure range from about 0.01 to 0.1 Torr.

Inductively-coupled plasma processes also cause the electrons to follow an extended path. The term "inductively coupled plasma" is used for two different techniques, both using alternating current to transformer couple energy to a gas. The first uses a ferrite magnetic core to enhance transformer coupling between a primary winding and a secondary turn consisting of a closed path through the gas. This technique normally uses low frequencies, below 550 Khz. The second technique uses a solenoid coil surrounding a cylindrical gas to be ionized. This technique can use either low frequencies or frequencies in the range of 13.56 Mhz. Neither of these techniques provides a uniform plasma adjacent and parallel to a wafer surface.

For these reasons, it would be desirable to provide apparatus and methods for generating highly uniform plasmas within semiconductor processing equipment, including etching equipment, deposition equipment, resist stripping, and the like. The apparatus should be capable of generating a high flux plasma over a very broad pressure range, and the plasma so produced should have little or no directed ion energy. Optionally, the apparatus should be capable of imparting directed energy to the plasma ions, with the control of directed energy being separate from the control of plasma flux. It would be particularly desirable if the apparatus were of a relatively simple design, were easy to operate and control, and required minimum capital expense. Similarly, the methods should be straightforward and easy to implement and should provide a high quality product in a short time with minimum expense.

2. Description of the Background Art

Skidmore (1989), Semiconductor International June 1989, pp 74–79, is a review article describing electron cyclotron resonance (ECR) and magnetically-enhanced reactive ion etch (MERIE) systems. U.S. Pat. No. 4,368,092, describes a plasma generating system employing a helical inductive resonator for producing the plasma external to an etching chamber. The plasma is non-uniform and passes through a tube before utilization. U.S. Pat. No. 4,421,898, describes an inductively-coupled plasma generating apparatus, where a transformer having a magnetic core induces electron circulation in an insulating tube carrying a process gas. Gas ionization is non-uniform, and exposure to the wafer occurs downstream. U.S. Pat. No. 4,626,312, describes a conventional parallel plate plasma etcher where the wafer is situated on a lower electrode and a plasma is generated by applying radiofrequency energy across the lower electrode and a parallel upper electrode. U.S. Pat. Nos. 4,668,338 and 4,668,365, describe magnetically-enhanced plasma processes for reactive ion etching and chemical vapor deposition, respectively.

SUMMARY OF THE INVENTION

According to the present invention, apparatus and methods are provided for producing highly uniform, planar plasmas over relatively large areas. The ionic and radical species produced in the plasma experience minimum acceleration in non-planar directions, and the resulting plasma thus has very low desired kinetic energy. As a particular advantage, the present invention is capable of producing such uniform, planar plasma over very wide pressure ranges, typically from $10^{-5}$ Torr to 5 Torr, and greater. Such an extended pressure operating range was not generally available before in a single plasma-producing apparatus. The method and device of the present invention are relatively simple to build, operate, and control, particularly in comparison with the magnetic field control requirements of ECR and MERIE.

The apparatus of the present invention comprises an enclosure having an interior bounded at least in part by a dielectric shield or window. A planar coil is disposed proximate the shield, and a radiofrequency source is coupled to the coil. Usually, the radiofrequency source is coupled through an impedance matching circuit to maximize power transfer and a tuning circuit to provide for resonance at the operating frequency, typically 13.56 MHz. Inlet ports are provided for supplying a process gas to the interior of the enclosure. By resonating a radiofrequency current through the coil, a planar magnetic field is induced which extends into the interior of the enclosure through the dielectric shield. In this way, a circulating flow of electrons may be induced. A circulating flow of electrons greatly increases the travel path before the electrons are likely to strike an enclosure wall. Moreover, as the electrons are closely confined to a plane parallel to the planar coil, transfer of kinetic energy in non-planar directions is minimized.

In the preferred embodiment, the enclosure includes a support surface for a planar article, typically a semiconductor wafer. The surface supports the wafer in a plane which is parallel to the plane of the coil, and hence, also parallel to the plane of the plasma. Thus, the semiconductor wafer is exposed to a highly uniform plasma flux, ensuring uniform plasma treatment. As the plasma species have minimum kinetic velocities in non-planar directions, their kinetic impact on the wafer is minimized. Thus, the treatment can be generally limited to the chemical interaction of the plasma species with the wafer.

The method and apparatus of the present invention are useful in a variety of semiconductor processing operations, including plasma etching, deposition processes, resist stripping, plasma enhanced chemical vapor deposition, and the like.

Optionally, a velocity component in the direction normal to the surface of the semiconductor wafer may be provided by applying a radiofrequency potential in a direction normal to the plane of the plasma. Conveniently, such a potential may be applied by and the support surface upon which the wafer is maintained.

BRIEF DESCRIPTION OF THE DRAWINGS

FIG. 1 is an isometric view of an apparatus for producing a planar plasma in accordance with the principles of the present invention.

FIG. 2 is a cross-sectional view of the apparatus of FIG. 1.

FIG. 3 is a schematic view of the circuitry of the apparatus in FIG. 1.

FIG. 4 is a detail view of a process gas introducing ring employed in the apparatus of FIG. 1.

FIG. 5 is a schematic view illustrating the magnetic field profile produced by the apparatus of FIG. 1.

FIG. 6 illustrates the circuitry of FIG. 3, modified to provide for a radiofrequency potential in a direction normal to the resonant coil.

FIG. 7 illustrates an alternative construction of the resonant coil of the present invention.

DESCRIPTION OF THE SPECIFIC EMBODIMENTS

The present invention will employ an enclosure which defines a generally air-tight interior chamber wherein the planar plasma is to be generated. The enclosure will include at least one inlet port for introducing a process gas and at least one outlet port for connection to a vacuum system for maintaining a desired operating pressure within the interior of the enclosure. Systems for supplying a preselected process gas and for maintaining a preselected pressure within the interior of the enclosure are well known in the art and need not be described further. Within the enclosure, there will usually be one or more surfaces for supporting the articles to be treated. Typically, the surfaces will be disposed in a preselected orientation relative to the planar plasma which is to be generated within the enclosure, usually being generally parallel to the plane of the plasma.

In order to induce the desired planar plasma, an electrically-conductive coil is disposed adjacent to the exterior of the enclosure. The coil will be substantially planar and will generally comprise a single conductive element formed into a planar spiral or a series of concentric rings. By inducing a radiofrequency current within the coil, a magnetic field is produced which will induce a generally circular flow of electrons within a planar region parallel to the plane of the coil.

The planar coil will generally be circular, although ellipsoidal patterns and other deviations from true circularity can be tolerated. Moreover, the coil may be truly planar across its diameter, or may deviate somewhat from true planarity. Deviations from planarity will usually be less than 0.2 of the diameter of the coil, usually being less than 0.1 of the diameter. Adjustments to the profile of the coil may be made to modify the shape of the electric field which is generated. The diameter of the coil will generally correspond to the size of the plasma which is to be generated. Coil diameters may range from about 8 cm to 20 cm, usually from about 13 cm to 18 cm. For the treatment of individual semiconductor wafers, the coil diameter will generally be from about 13 to 18 cm.

The coil will include a sufficient number of turns in order to produce a relatively uniform magnetic field across its entire diameter. The number of turns will also depend on the diameter of the coil, with a coil sized for treating individual semiconductor wafers usually having from about 5 to 8 turns. The resulting inductance of the coil will usually be from 1.2 to 3.5 $\mu$H, with an impedance in the range from about 100 to 300 Ohms.

Conveniently, the planar coil may be formed from any electrically conductive metals, usually being formed from copper. The coil will have a current carrying capacity in the range from about 5 to 30 amps.

The planar coil will be disposed next to a dielectric shield formed in the treatment enclosure. The dielectric shield will maintain the isolation of the interior of the enclosure, while allowing penetration of the magnetic field produced by the planar coil. The remainder of the enclosure will usually be metal. The dielectric shield will usually be composed of quartz, although other dielectric materials, particularly ceramics which do not absorb energy at the frequency of operation, may find use. Conveniently, dielectric shields may be placed adjacent to a port formed in a wall of the enclosure. The geometry of the port will usually correspond to that of the planar coil, typically being circular. The planar coil will be disposed very close to or touching the dielectric shield in order to maximize the intensity of the magnetic field produced within the enclosure. The thickness of the dielectric shield is not critical, usually being selected to be sufficient to withstand the differential pressure created by the vacuum within the enclosure.

The planar coil will be driven by a radiofrequency (RF) generator of a type which is generally utilized in the operation of semiconductor processing equipment. The RF generator will usually operate at a frequency in the range from about 13.56 MHz to 100 MHz, typically being operated at 13.56 MHz. The RF generator will usually have a low impedance, typically about 50 Ohms, and will be capable of producing from about 1 to 6 amps, usually from about 2 to 3.5 amps, with an RMS voltage of at least about 50 volts, usually being at least about 70 volts, or more. Conveniently, the RF generator will have an output connector in the form of a coaxial cable which may be connected directly to the circuitry of the present invention, as described in more detail hereinafter.

Referring now to FIGS. 1 and 2, a plasma treatment system 10 suitable for etching individual semiconductor wafers W will be described. The system 10 includes an enclosure 12 having an access port 14 formed in an upper wall 16. A dielectric shield 18 is disposed below the upper wall 16 and extends across the access port 14. The dielectric shield 18 is sealed to the wall 16 to define a vacuum-tight interior 19 of the enclosure 12.

A planar coil 20 is disposed within the access port 14 adjacent the dielectric shield 18. Coil 20 is formed as a spiral having a center tap 22 and an outer tap 24. The plane of the coil 20 is oriented parallel to both the dielectric shield 18 and a support surface 13 upon which the wafer W is mounted. In this way, the coil 20 is able to produce a planar plasma within the interior 19 of the enclosure 12 which is parallel to the wafer W, as described in more detail hereinbelow. The distance between the coil 20 and the support surface 13 is usually in the range from about 3 to 15 cm, more usually from about 5 to 10 cm with the exact distance depending on the particular application.

Referring now to FIGS. 1-3, the planar coil 20 is driven by an RF generator 30 of the type described above. The output of the generator 30 is fed by a coaxial cable 32 to a matching circuit 34. The matching circuit 34 includes a primary coil 36 and a secondary loop 38 which may be mutually positioned to adjust the effective coupling of the circuit and allow for loading of the circuit at the frequency of operation. Conveniently, the primary coil 36 is mounted on a disk 40 which may be rotated about a vertical axis 42 in order to adjust the coupling.

A variable capacitor 44 is also provided in series with the secondary loop 38 in order to adjust the circuit resonant frequency with the frequency output of the RF generator 30. Impedance matching maximizes the efficiency of power transfer to the planar coil 20. An additional capacitor 46 is provided in the primary circuit in order to cancel part of the inductive reactance of coil 36 in the circuit.

It will be appreciated that other circuit designs might also be provided for resonantly tuning the operation of planar coil 20 and for matching the impedance of the coil circuit with the RF generator. All such variations in the circuitry are considered to be within the scope of the present invention.

Referring now to FIGS. 2 and 4, process gas is introduced into the interior 19 of enclosure 12 through a port 50 formed through the side of the enclosure. The location of the port is not critical, and gas may be introduced at any point which provides for its even distribution throughout the interior 19.

In order to further enhance the uniformity of gas distribution, a distribution ring 52 may be provided. The ring 52 is conveniently located above the support surface 13 and circumscribing the periphery of access port 14. The ring 52 includes an annular plenum 54 and a series of nozzles 56 extending from the plenum to the open center 58 of the ring. In this way, the incoming process gas ma be evenly distributed about the area of maximum intensity of the magnetic field induced by planar coil 20. Preferably, the nozzle 56 will be oriented away from the radial direction in order to impart a spiral flow pattern to the incoming gas.

Referring now to FIG. 5, planar coil 20 induces a magnetic field which penetrates the dielectric shield 18 and has a field strength profile 60 as shown in broken line. The varying magnetic field inside the plasma chamber is the vector sum of the magnetic field from the spiral coil and the magnetic field caused by the electron current flow in the plasma. Since the magnetic field from the plasma opposes the magnetic field from the coil, a uniform resulting magnetic field requires that the magnetic field from the coil is more intense toward the center. The spiral coil provides this specially shaped magnetic field to provide a resulting uniform magnetic field and thus a uniform plasma. The field strength is highly uniform across the entire diameter of the coil 20, and is thus capable of producing a highly uniform flux of electrons which circulate within a generally planar region parallel to both the coil and the shield 18. Such planar circulation of electrons, in turn, is able to induce a highly uniform flux of ions and/or radicals in the plasma which is created by the collision of the electrons with the individual molecules of the process gas. While the plasma ions and radicals will have a small alternating circular velocity component, there will be little or no velocity component in the direction normal to the plane of coil 20. So long as the wafer W (or other article being treated) is oriented parallel to the coil, the reactive plasma species will have a very low velocity relative to the surface being treated. In this way, the problems associated with utilizing high energy plasmas having substantial velocity components relative to the article being treated can be avoided.

In some cases, however, it is desired to have a controlled ion velocity relative to the article being treated. Referring to FIG. 6, a velocity component in the direction normal to wafer W can be achieved by applying an RF potential across the planar coil 20 and an electrically conductive wafer support 70. RF generator 72 can operate at low frequency (below about 550 kHz) or high frequency (13.56 MHz or above), usually operating at a different frequency than the generator 30 which induces a resonant current flow in coil 20. Conveniently, if RF generator 30 operates at 13.56 MHz, the second RF generator 72 may operate at 400 kHz. A particular advantage of the system illustrated in FIG. 6 results from the ability to independently control the ion flux in the plasma (by controlling the amount of energy introduced to the system through RF generator 30) and the normal velocity imparted to the reactive species (by controlling the power output of RF generator 72).

Referring now to FIG. 7, an alternate configuration for the planar coil of the present invention is illustrated. Planar coil 80 comprises a series of concentric loops 82, where each succeeding loop is connected by a short transverse member 84. The coil 80 further includes a center tap 86 and outer tap 88, and may be connected to the remaining circuitry of the present invention as previously described.

In operation, a preselected process gas is introduced into the interior 19 through the inlet port 50, as previously described. The operating pressure will depend on the particular process being performed. A particular advantage of the present invention is found in the very broad pressure range over which plasma may be produced. By inducing resonant current in coil 20, plasmas may be produced at pressures as low as $10^{-5}$ Torr and as high as 5 Torr.

Although the foregoing invention has been described in detail for purposes of clarity of understanding, it will be obvious that certain modifications may be practiced within the scope of the appended claims.

What is claimed is:

1. An apparatus for producing a planar plasma, said apparatus comprising:
   an enclosure having an interior bounded at least in part by a dielectric shield;
   means for introducing a process gas to the interior of the enclosure;
   an electrically-conductive substantially planar coil disposed outside the enclosure proximate the dielectric shield; and
   means for coupling a radiofrequency source to the coil, said coupling means including (1) means for matching the impedance of the radiofrequency source to the coil and (2) means for tuning the resulting circuit to provide for resonance.

2. An apparatus as in claim 1, wherein the planar coil is arranged as a spiral.

3. An apparatus as in claim 1, wherein the planar coil is arranged as a series of concentric loops.

4. An apparatus as in claim 1, wherein the dielectric shield is composed of quartz.

5. An apparatus as in claim 1, wherein the means for introducing a process gas includes a plurality of ports which circumscribe the dielectric shield.

6. An apparatus as in claim 1, wherein the impedance matching means includes a pair of mutually rotatable coils.

7. An apparatus as in claim 1, wherein the tuning means includes a variable capacitor.

8. An apparatus for treating articles with a plasma, said apparatus comprising:
   an enclosure having an interior bounded at least in part by a dielectric shield;
   means within the enclosure for supporting the article to be treated in a preselected plane;
   an electrically conductive planar coil disposed outside the enclosure proximate the dielectric shield, said coil being oriented parallel to the preselected plane;
   means for coupling a radiofrequency source to the planar coil; and
   means for introducing a process gas into the enclosure under controlled pressure.

9. An apparatus as in claim 8, wherein the coil is arranged as a spiral.

10. An apparatus as in claim 8, wherein the coil is arranged as concentric loops.

11. An apparatus as in claim 8, wherein the means for coupling the radiofrequency generator includes (1) means for matching the impedance of the radiofrequency source to the planar coil and (2) means for tuning the circuit to provide for resonance.

12. An apparatus as in claim 11, wherein the impedance matching means includes a pair of mutually rotatable coils.

13. An apparatus as in claim 11, wherein the tuning means includes a variable capacitor.

14. An apparatus as in claim 8, wherein the dielectric shield is composed of quartz.

15. An apparatus as in claim 8, wherein the means for introducing the process gas includes a plurality of ports which circumscribe the dielectric shield.

16. An apparatus as in claim 8, further comprising means for applying a radiofrequency potential across the planar coil and the supporting means within the enclosure.

17. A method for treating article with a plasma, said method comprising:
   placing the article within an enclosure;
   introducing a process gas to the enclosure at a controlled pressure; and
   resonating a radiofrequency current in a substantially planar coil located outside the enclosure proximate a dielectric shield formed in the enclosure, whereby a planar plasma substantially parallel to the coil is formed inside the enclosure.

18. A method as in claim 17, wherein the article is a planar article which is oriented in a plane parallel to the planar coil.

19. A method as in claim 18, wherein the planar article is a semiconductor wafer.

20. A method as in claim 17, wherein the process gas is an etchant.

21. A method as in claim 20, wherein the etchant is a halocarbon.

22. A method as in claim 17, wherein the planar coil is tuned to resonate at a frequency of about 13.56 MHz.

23. A method as in claim 17, further comprising applying a radiofrequency potential across the planar coil and a surface within the enclosure on which the article is supported, whereby plasma ions and radicals are accelerated in a direction normal to the planar article.

24. A method as in claim 23, wherein the radiofrequency potential is at a frequency of about 13.56 MHz.

* * * * *

UNITED STATES PATENT AND TRADEMARK OFFICE
CERTIFICATE OF CORRECTION

PATENT NO. : 4,948,458
DATED : August 14, 1990
INVENTOR(S) : John S. Ogle

It is certified that error appears in the above—identified patent and that said Letters Patent is hereby corrected as shown below:

Column 3, line 60, after "by" please insert —connecting a radiofrequency source across the planar coil—.

Column 6, line 24, please cancel "ma" and insert therefor —may—.

Signed and Sealed this

Thirty-first Day of December, 1991

Attest:

HARRY F. MANBECK, JR.

*Attesting Officer*  *Commissioner of Patents and Trademarks*